(12) United States Patent
Maeda (10) Patent No.: US 6,252,812 B1
(45) Date of Patent: Jun. 26, 2001

(54) SEMICONDUCTOR MEMORY DEVICE UTILIZING MULTIPLE EDGES OF A SIGNAL

(75) Inventor: Kazunori Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/571,916

(22) Filed: May 16, 2000

(30) Foreign Application Priority Data

May 17, 1999 (JP) .................................................. 11-135437

(51) Int. Cl.[7] ........................................................ G11C 7/00
(52) U.S. Cl. ........................ 365/201; 365/189.05; 365/233
(58) Field of Search ............................... 365/201, 189.05, 365/233, 189.01, 230.01

(56) References Cited

U.S. PATENT DOCUMENTS

| | | | |
|---|---|---|---|
| 5,604,701 | * | 2/1997 | Alexander et al. ............. 365/189.02 |
| 5,815,444 | * | 9/1998 | Ohta ................................. 365/189.05 |
| 5,844,844 | * | 12/1998 | Bauer et al. ..................... 365/189.05 |
| 5,857,005 | * | 1/1999 | Buckenmaier ....................... 375/357 |
| 6,058,448 | * | 5/2000 | Pawlowski ........................... 710/107 |

* cited by examiner

*Primary Examiner*—Hoai V. Ho
(74) *Attorney, Agent, or Firm*—Scully, Scott, Murphy & Presser (57) ABSTRACT

There will be provided a semiconductor memory capable of conducting, at low cost, various tests to be conducted before shipment without affecting the normal operation. When a test signal TESTA is activated, either an amplifier AMPO64 for writing data in an odd address or an amplifier AMPE66 for writing data in an even address is annulled in accordance with the logical level of the column address Y0 to thereby enable writing one address at a time to be performed. In this way, various tests can be conducted on the same conditions as the normal SDRAM, thus making it possible to restrain the manufacturing cost.

7 Claims, 10 Drawing Sheets

SEMICONDUCTOR MEMORY DEVICE UTILIZING MULTIPLE EDGES OF A SIGNAL

BACKGROUND OF THE INVENTION

1. Field of the Invention

The present invention relates to a semiconductor memory, and more particularly to a DDR-SDRAM (Double Data Rate Synchronous Dynamic Random Access Memory).

2. Description of Related Art

In recent years, performance of the CPU has been noticeably improved. If, however, no matter how fast an operating speed of the CPU may be increased, a data transfer rate of a DRAM to be used as its main memory does not catch up with it, the CPU will not be able to exhibit its performance. For this reason, improvement in the data transfer rate of the DRAM has been strongly requested in recent years, and as one meeting this request, SDRAM (Synchronous Dynamic Random Access Memory) has been already developed.

The SDRAM is a memory capable of continuously reading out, upon receipt of a clock signal from outside of the chip, each data stored in continuous addresses in synchronism with the clock signal, and the interior thereof is rendered as pipelines to make the operation fast.

However, the frequency of a clock signal to be used for the SDRAM is not higher than about 100 MHz, but is still low as compared with the operating frequency of the CPU. On the other hand, it is difficult in view of the circuit characteristics within the DRAM to further increase the frequency of the clock signal.

In order to solve this problem, a DDR-SDRAM has been proposed and put into practical use in which both leading edge and trailing edge of the clock signal are used. The DDR-SDRAM uses both edges of the clock signal, and therefore, is capable of performing the same high-rate data transfer as the frequency of the clock signal redoubled equivalently.

Figure 8:
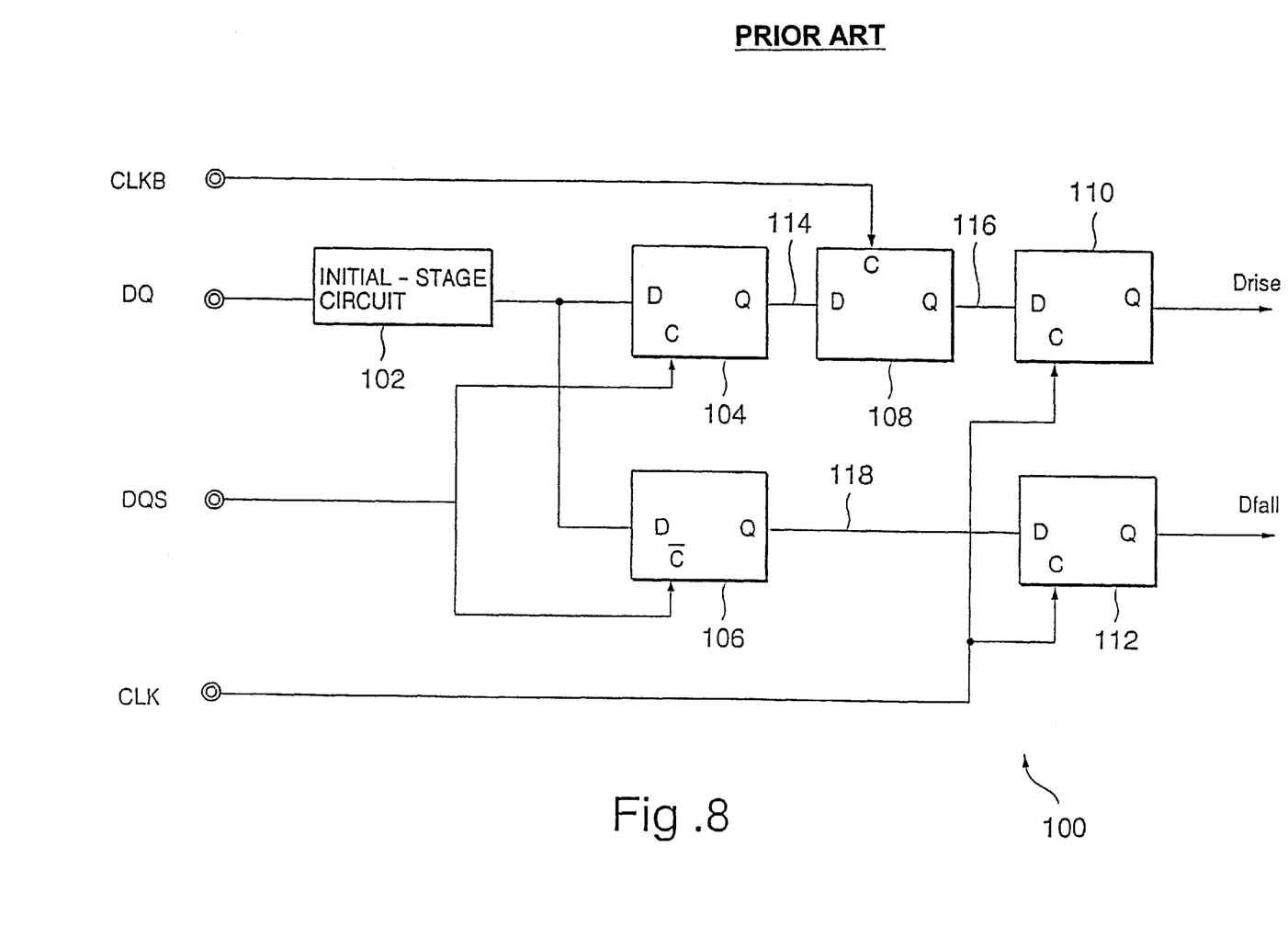
FIG. 8 is view showing a conventional input/latch circuit 100.

FIG. 8 is a view showing a conventional input/latch circuit 100 in the DDR-SDRAM. The input/latch circuit 100 shown in FIG. 8 is provided with a flip flop 104 for holding write data supplied to a data input/output terminal DQ at a leading edge of a timing signal DQS; a flip flop 106 for holding at its trailing edge; a flip flop 108 for holding output 114 from the flip flop 104 in response to a leading edge of an inversion clock signal CLKB; and a flip flop 110 and a flip flop 112 for holding output 116 from the flip flop 108 and output 118 from the flip flop 106 respectively in response to the leading edge of the clock signal CLK. In this respect, an initial-stage circuit 102 is a circuit to convert amplitude of write data to be supplied to the data input/output terminal DQ into amplitude to be used within the chip.

Figure 9:
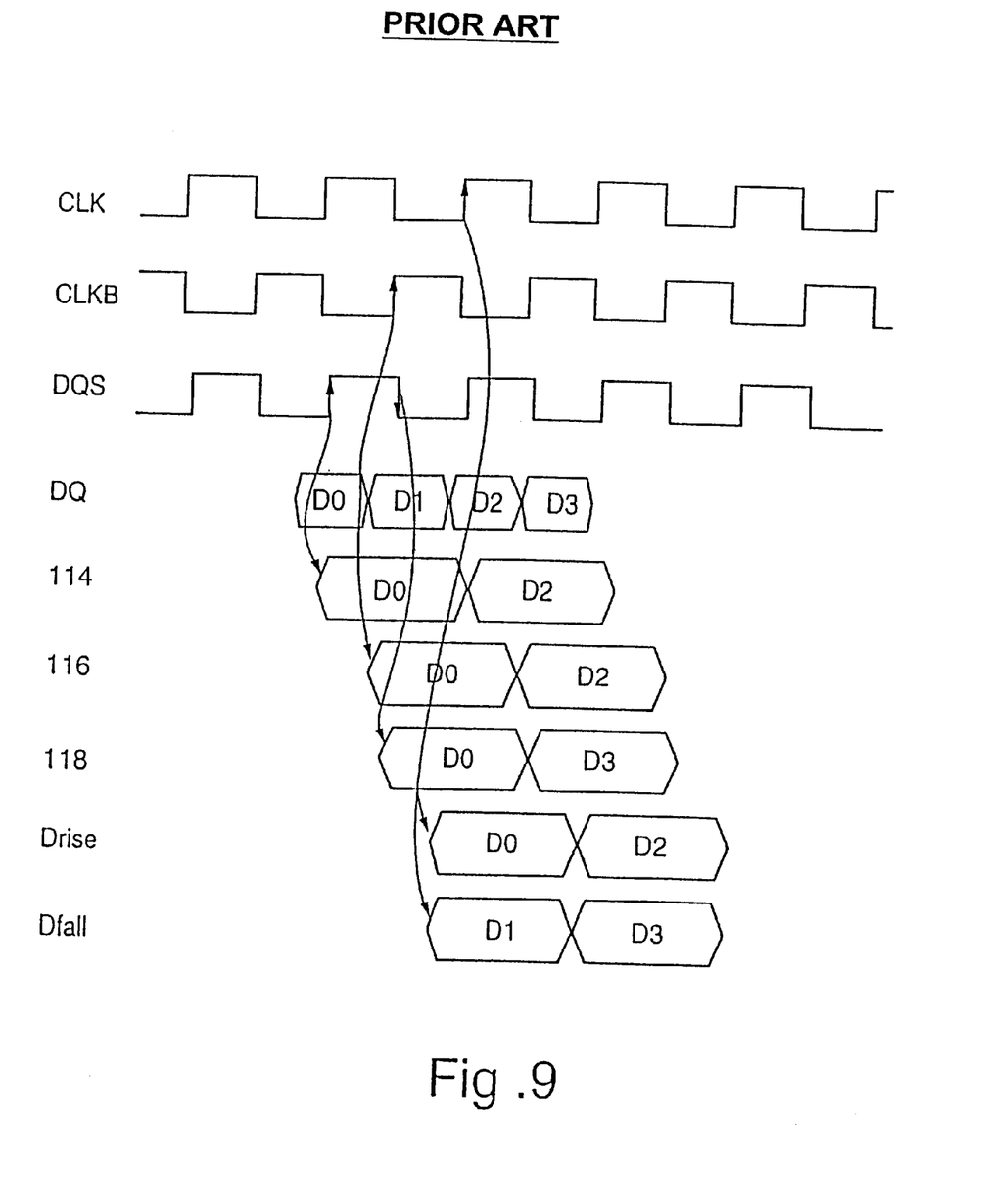
FIG. 9 is a timing diagram showing an operation of an input/latch circuit 100.

FIG. 9 shows an operation of the input/latch circuit 100. In this respect, as shown in FIG. 9, an inversion clock signal CLKB is a signal obtained by inverting the phase of the clock signal CLK, and a timing signal DQS is a timing signal in synchronism with the clock signal CLK.

As shown in FIG. 9, write data to be supplied to the data input/output terminal DQ varies in a period equal to half the period of the clock signal CLK, and these write data are held by the flip flop 104 in response to the leading edge of the timing signal DQS, and are held by the flip flop 106 in response to the trailing edge of the timing signal DQS. A signal held by the flip flop 104 is indicated as output 114, and a signal held by the flip flop 106 is indicated as output 118. Of these, the output 116 is held by the flip flop 108 in response to the leading edge of the inversion clock signal CLKB, and its output is indicated as 116.

These output 116 and 118 are held by the flip flops 110 and 112 respectively in response to the leading edge of the clock signal CLK, and their output becomes Drise and Dfall respectively.

These Drise and Dfall are written in parallel in a memory cell via a data write circuit (not shown).

As described above, in the input/latch circuit 100, write data to be supplied to the data input/output terminal DQ are latched using both a leading edge and a trailing edge of the timing signal DQS, and these write data thus latched are arranged in parallel within. Therefore, apparently, it looks as if the operation was performed in a frequency twice as high as that of the clock signal CLK. If the frequency of the clock signal CLK is, for example, 100 MHz, the frequency of the write data will become 200 MHz. In this case, it can be seen that the interior of the DDR-SDRAM is operating firmly at 100 MHz and the data transfer rate is increased without raising the operating frequency within the chip.

As described above, the DDR-SDRAM captures write data by taking advantage of both edges of the timing signal DQS using the timing signal DQS and the inversion clock signal CLKB, and arranges the write data in parallel within, and therefore, the high-rate data transfer is realized. For this reason, even in various tests of the DDR-SDRAM to be conducted before shipment, it is necessary to supply the timing signal DQS and the inversion clock signal CLKB to the chip, but the timing signal DQS and the inversion clock signal CLKB are signals which are not normally used in the SDRAM. For this reason, a test apparatus, which has been used in the normal SDRAM test in which the timing signal DQS and the inversion clock signal CLKB are not used, cannot be used for the test for the DDR-SDRAM as it is, but the need for a test apparatus exclusively used for the DDR-SDRAM arises.

Among various tests to be conducted before shipment, however, there are also included a multiplicity of tests which have not to be conducted while being operated at high speed, such as, for example, a bar-in test (acceleration test) and if the test apparatus exclusively used for the DDR-SDRAM has to be used for such tests, the cost would be increased to raise the unit price of the chip.

SUMMARY OF THE INVENTION

Therefore, it is an object according to the present invention to provide a semiconductor memory capable of conducting, at low cost, various tests to be conducted before shipment.

According to the present invention, there is provided a semiconductor memory comprising: a first flip flop circuit for holding, in response to a clock signal, write data fetched in response to one edge of a timing signal; a second flip flop circuit for holding, in response to the clock signal, write data fetched in response to the other edge of the timing signal; a write circuit for writing write data held by the first and second flip flop circuits on memory cell array in parallel, characterized by having means for storing common write data in the first and second flip flop circuits in response to the clock signal independently of the timing signal during a test.

Also, there is provided a semiconductor memory further comprising: a third flip flop circuit for holding write data in response to the one edge of the timing signal; and a fourth flip flop circuit for holding write data in response to the other edge of the timing signal, characterized in that the means supplies write data held by the third and fourth flip flop circuits to the first and second flip flop circuits respectively during a normal operation, and commonly supplies write data to the first and second flip flops while write data held by the third and fourth flip flop circuits are inhibited from being supplied to the first and second flip flop circuits respectively during the test.

Further, the write circuit is characterized by comprising: a first amplifier for writing write data held by the first flip flop circuit on the memory cell array; a second amplifier for writing write data held by the second flip flop circuit on the memory cell array; and inhibit means for inhibiting an operation of either of the first and second amplifiers during the test.

Further, the inhibition means is also characterized by determining the operation of which of the amplifiers should be inhibited based on part of an address signal.

Further, it is characterized in that the part of the address signal is a specific bit of a column address, and that in the memory cell array, two memory cells being different from each other only in the specific bit of the column address are arranged adjacent to each other.

Also, the DDR-SDRAM according to the present invention is provided, in a DDR-SDRAM for fetching write data at one and the other edges of a timing signal, with first write means for receiving write data fetched at the one edge of the timing signal to write them on the memory cell array; second write means for receiving write data fetched at the other edge of the timing signal to write them on the memory cell array; and means for inhibiting, when the test signal is in an activated state on receipt of the test signal and the specific bit of column address, either write operation of the first and second write means based on the specific bit of the column address.

In addition, it is also characterized in that the first and second write means include the first and second amplifiers respectively, and that the inhibition means forcibly activates either of the first and second mask signals for inhibiting the operations of the first and second amplifiers respectively.

DETAILED DESCRIPTION OF THE PREFERRED EMBODIMENTS

Next, with reference to the drawings, the description will be made of a semiconductor memory according to embodiments of the present invention.

Figure 1:
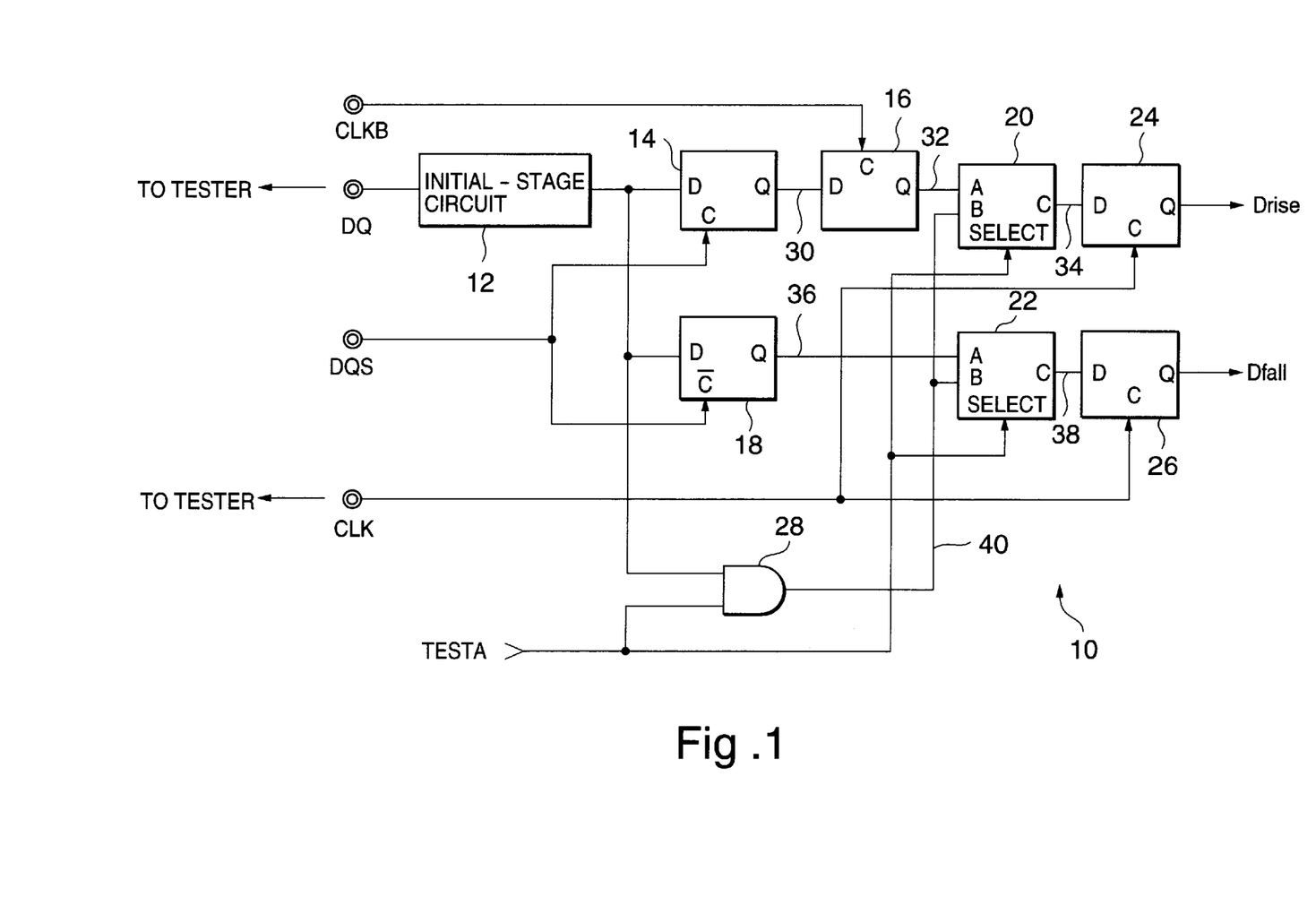
FIG. 1 is a view showing an input/latch circuit 10 included in a semiconductor memory according to an embodiment of the present invention.

FIG. 1 is a block diagram showing an input/latch circuit 10 included in a semiconductor memory according to an embodiment of the present invention.

As shown in FIG. 1, the input/latch circuit 10 is provided with: a flip flop 14 for holding write data supplied to a data input/output terminal DQ in response to a leading edge of a timing signal DQS; a flip flop 18 for holding the write data in response to a trailing edge of the timing signal DQS; a flip flop 16 for holding output 30 from the flip flop 14 in response to a leading edge of an inversion clock signal CLKB; switch circuits 20 and 22 for connecting one of an input end A and an input end B to an output end C on the basis of SELECT input; flip flops 24 and 26 for holding output 34 and 38 from the switch circuits 20 and 22 in response to a leading edge of the clock signal CLK respectively; and an AND gate 28. In this respect, an initial-stage circuit 12 is a circuit to convert amplitude of write data to be supplied to the data input/output terminal DQ into amplitude to be used within the chip.

Figure 2:
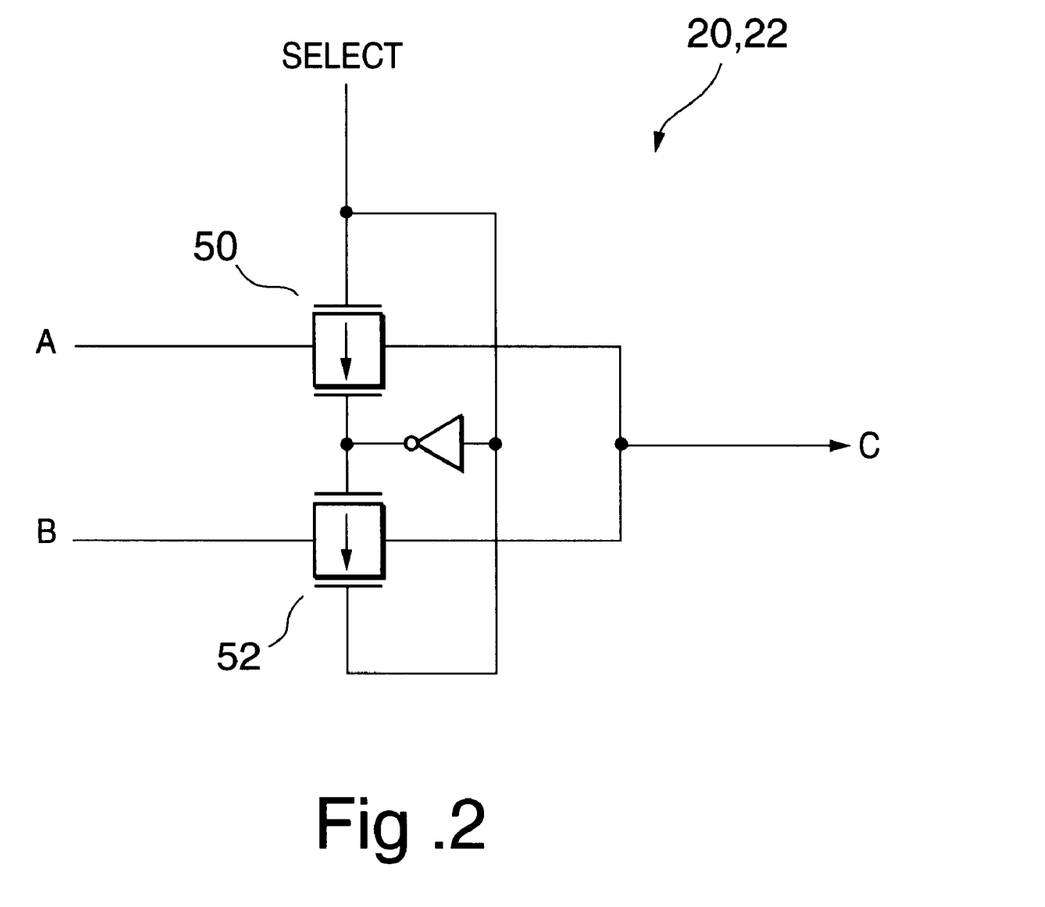
FIG. 2 is a circuit diagram for a switch circuit 20, 22 shown in FIG. 1.

FIG. 2 shows a circuit configuration of a switch circuit 20, 22. As shown in FIG. 2, the switch circuit 20, 22 has two transfer gates 50 and 52, and either of them conducts in accordance with the logical level of a SELECT signal. Concretely, when the logical level of the SELECT signal is "L", the transfer gate 50 conducts, and the input end A is connected to the output end C. When the logical level of the SELECT signal is "H", the transfer gate 52 conducts, and the input end B is connected to the output end C. The circuit configuration of the switch circuit 20, 22 shown in FIG. 2, however, is only a preferred example according to the present embodiment, and any other circuits than the circuit shown in FIG. 2 may be used, so long as they have the same function.

Figure 3:
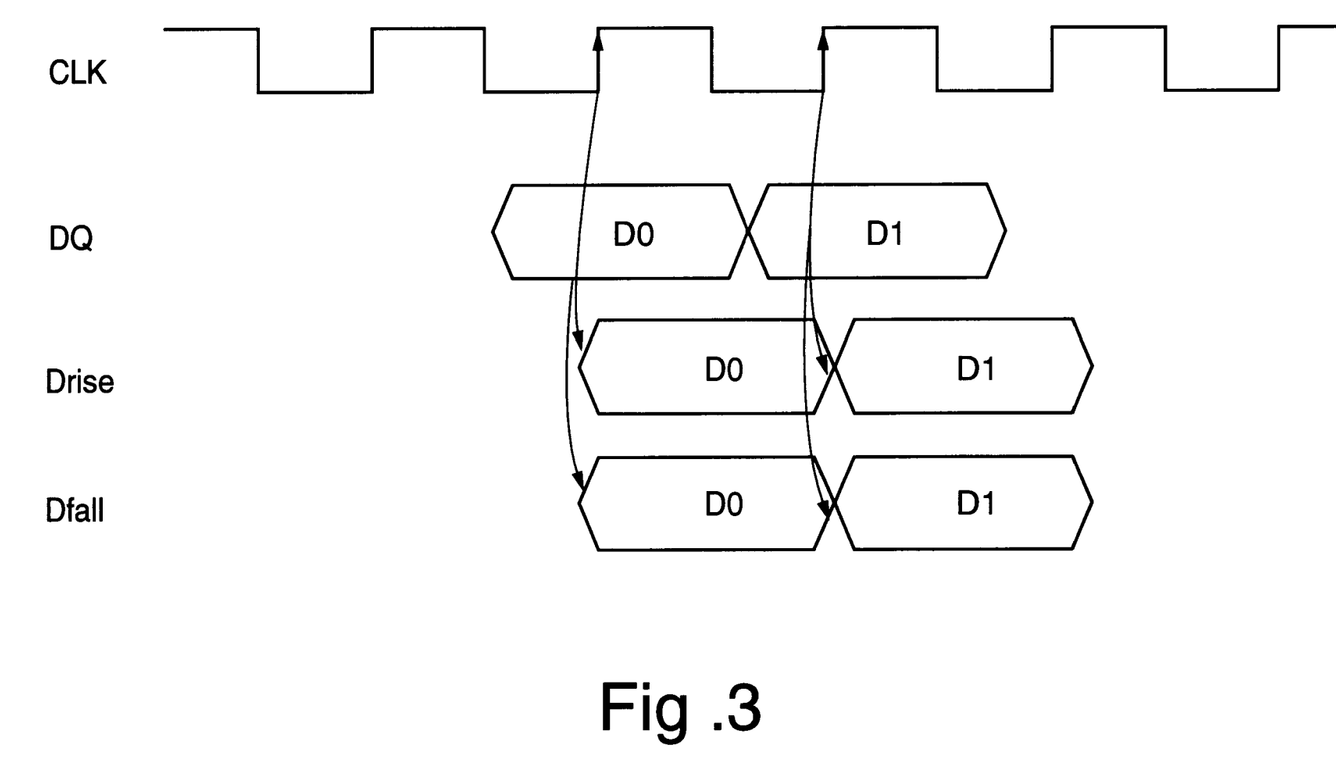
FIG. 3 is a timing chart showing an operation of the input/latch circuit 10 shown in FIG. 1.
Figure 6:
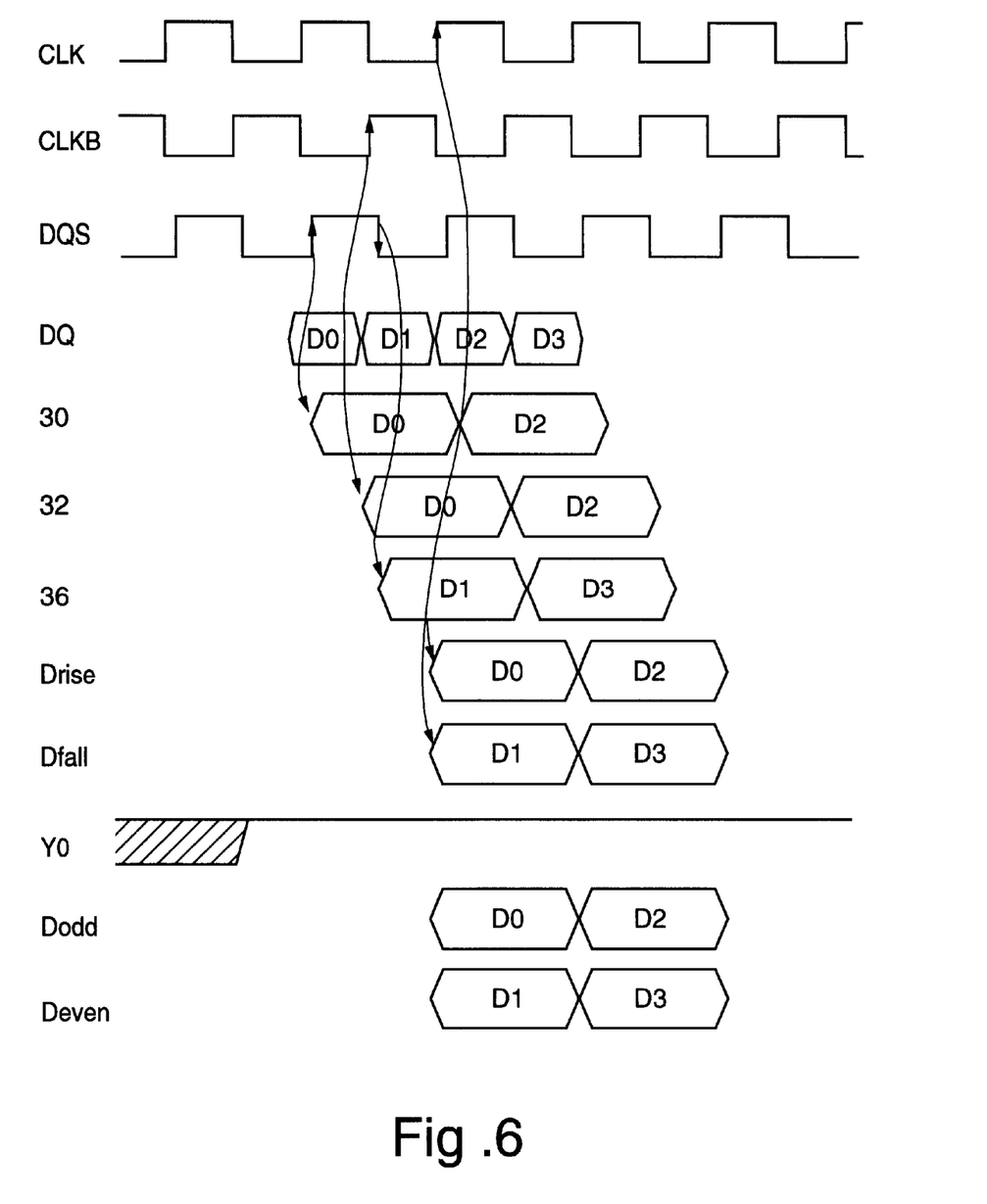
FIG. 6 is a timing chart showing an operation of an input/latch circuit 10 shown in FIG. 1 and an operation of an input unit 60 shown in FIG. 4.

FIGS. 3 and 6 show the operation of the input/latch circuit 10. FIG. 3 is a timing chart when a test signal TESTA is at a high level (activated state), and FIG. 6 is a timing chart when a test signal TESTA is at a low level (inactivated state).

The description will be made of the test signal TESTA. The test signal TESTA is an internal signal for placing the interior of the chip in a test mode, and is activated by storing information indicating the test mode in a mode register (not shown) provided within the chip. The mode register is a register for selecting, from among various operating modes provided for the chip, in which operating mode the operation should be performed, and CAS latency, burst length and the like are set by changing the contents of this mode register. The change in the contents of the mode register is permitted by setting a predetermined external pin to a predetermined logical level. If, for example, /CS (Chip Select) terminal, /RAS (Low Address Strobe) terminal, /CAS (Column Address Strobe) terminal and /WE (Write Enable) terminal (all not shown) are all set to a low level (activated state), whereby setting of the mode register is permitted, and information to be supplied to a specific address terminal (not shown) at that time is set to the mode register.

The test signal TESTA is an internally-generated signal when the test mode is selected from among various operating modes to be thus selected, and it will enter a high level when the test mode is started. In the other cases, a low level is always maintained.

First, the description will be made of a case where such a test signal TESTA is at a low level (during a normal operation). When the test signal TESTA is at a low level, a low-level signal is supplied to either of the SELECT terminals of the switch circuits 20 and 22, and therefore, the input terminal A is selected in either the switch circuit 20 or 22. In this case, the operation of the input/latch circuit 10 becomes the same as in the operation in the conventional case (FIG. 6). Therefore, write data fetched in response to the leading edge of the timing signal DQS and write data fetched in response to the trailing edge of the timing signal DQS are arranged in parallel as Drise and as Dfall respectively, and are written on the memory cell in parallel via a data write circuit (not shown). Thus, apparently, it looks as if the operation was performed at a frequency twice as high as that of the clock signal CLK as already described.

In this respect, the inversion clock signal CLKB is a signal obtained by inverting the phase of the clock signal CLK, and the timing signal DQS is a timing signal in synchronism with the clock signal CLK.

Next, the description will be made of a case where the test signal TESTA is at a high level (during a test operation). When the test signal TESTA is at a high level, a high-level signal is supplied to either of the SELECT terminals of the switch circuits 20 and 22, and therefore, the input terminal B is selected in either the switch circuit 20 or 22. In this case, since all the signals to be supplied to the input end A are ignored, the operations of the flip flops 14, 16 and 18 will be completely ignored.

A signal 40 supplied to the input end B is a signal obtained by ANDing the test signal TESTA and write data applied to the data input/output terminal DQ with an AND gate 28. At this time, since the test signal TESTA is at a high level, the signal 40 becomes the write data themselves supplied to the data input/output terminal DQ. In other words, the write data will be applied as they are to the flip flops 24 and 26.

This state is shown in the timing chart of FIG. 3, and it can be seen that the write data supplied to the data input/output terminal DQ become Drise and Dfall in response to the leading edge of the clock signal CLK.

When the test signal TESTA is at a high level as described above, the operations of the flip flops 14, 16 and 18 are ignored, and therefore, it becomes unnecessary to supply the timing signal DQS and the inversion clock signal CLKB, which are control signals for these flip flops 14, 16 and 18. In other words, even if these DQS terminal and CLKB terminal are not connected to a tester (testing apparatus) during a test such as the bar-in test as shown in FIG. 1, it can be realized to write in a memory cell by connecting, to the tester, only terminals to be used even in an ordinary SDRAM such as the DQ terminal and the CLK terminal. In this way, on conducting a test, in which any high-speed operation essential to the DDR-SDRAM does not have to be performed like the bar-in test, a tester which has been used for an ordinary SDRAM can be used as it is for a test for the DDR-SDRAM. For this reason, the increase in test expenses can be restrained.

In this respect, in the above-described example, the description has been made of the case where the test is conducted without connecting anything to the DQ terminal and the CLKB terminal, but the present invention is not limited thereto, but these terminals may be fixed to, for example, ground potential during the test. In either case, since signals from the flip flops 14, 16 and 18 are not selected in the switch circuits 20 and 22, the operation of the input/latch circuit 10 is not affected by the states of the DQ terminal and the CLKB terminal. In the present embodiment, the clock signal and the inversion clock signal to be applied to the CLK terminal and the CLKB terminal respectively as shown in FIG. 1 are supplied as they are to the flip flop 16 and the like. However, the present invention is not limited thereto, but it may be possible to arrange the structure such that there is provided, for example, a difference amplifier for receiving a clock signal to be applied to the CLK terminal and an inversion clock signal to be applied to the CLKB terminal, and that output from this difference amplifier is supplied to the flip flop 16 and the like as a clock signal and an inversion clock signal within the chip. Concretely, there are preferably provided two difference amplifiers for receiving a clock signal to be applied to the CLK terminal and an inversion clock signal to be applied to the CLKB terminal such that one difference amplifier generates an internal clock signal which rises at the leading edge (trailing edge of inversion clock signal) of a clock signal, and that the other difference amplifier generates an internal inversion clock signal which rises at the trailing edge (leading edge of inversion clock signal) of a clock signal for supplying the internal clock signal and internal inversion signal to the flip flop 16 and the like. When such structure is adopted, an intermediate potential, for example, reference potential Vref can be supplied to the CLKB terminal during the test.

Figure 10:
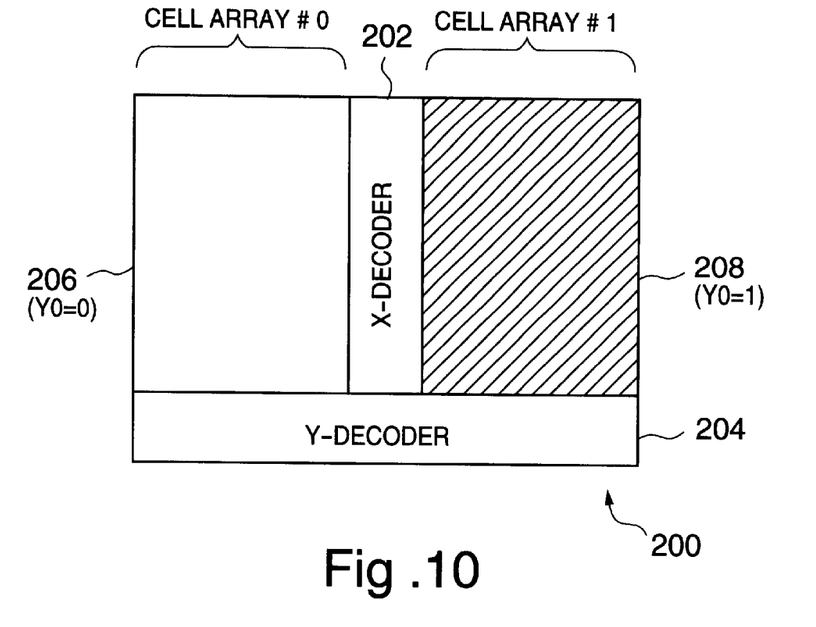
FIG. 10 shows an example of chip structure in which a cell array is divided in accordance with a logical level of a column address Y0.

As described above, when the test signal TESTA is at a high level, Drise=Dfall, and the same data will be written in two addresses which are different from each other only in column address Y0. Therefore, for example, when the chip configuration is that the cell array is divided by the column address Y0 as shown in FIG. 10, the same data will be written in both cell array 206 and 208. In this case, even when, for example, it is necessary to make data to be stored in memory cells which are adjacent to each other in the bar-in test into data which are different from each other, such a data pattern can be written in both cell array at the same time.

Next, with reference to FIGS. 4 to 7, the description will be made of a semiconductor memory according to another embodiment of the present invention.

Figure 4:
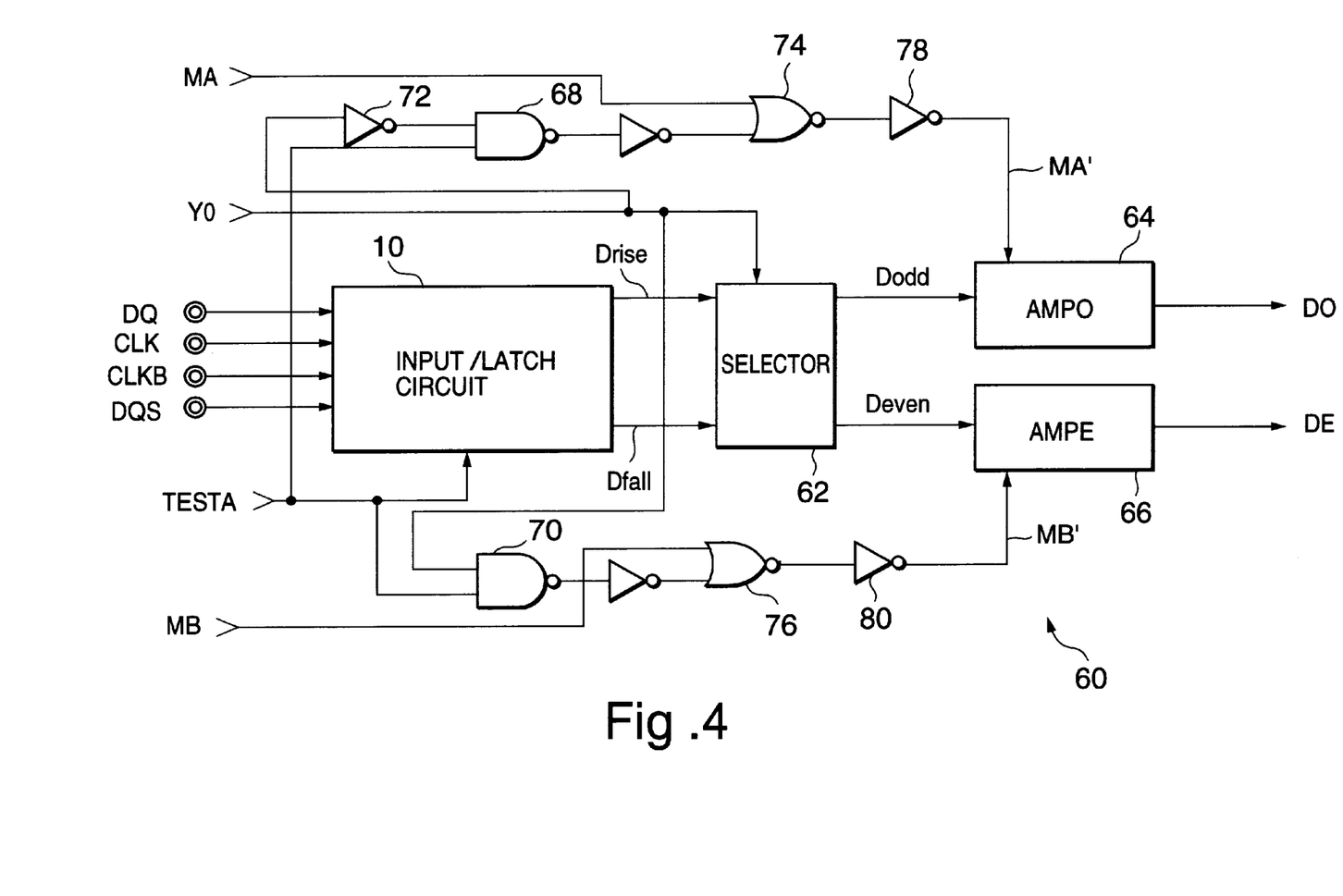
FIG. 4 is a view showing an input unit 60 included in a semiconductor memory according to another embodiment of the present invention.

FIG. 4 is a view showing an input unit 60 in a semiconductor memory according to the present embodiment. The input unit 60 is provided with: an input/latch circuit 10; a selector 62 for selecting the output; an amplifier AMPO64 and an amplifier AMPE66 for receiving output Dodd and Deven from the selector 62 respectively; and various gate circuits.

Figure 5:
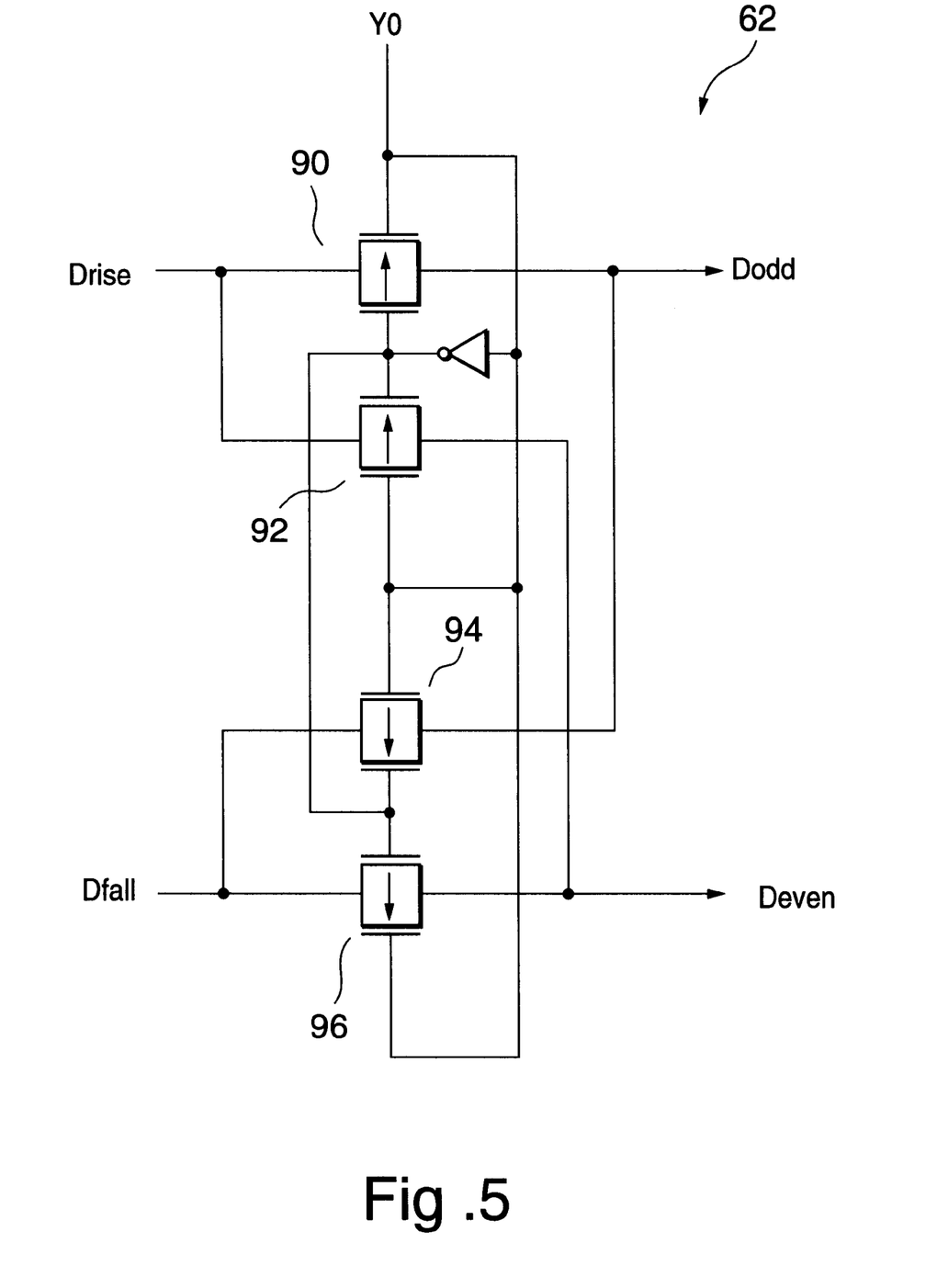
FIG. 5 is a circuit diagram for a selector 62 shown in FIG. 4.

The input/latch circuit 10 is the input/latch circuit 10 shown in FIG. 1, and its circuit configuration and operation are as already described. The selector 62 is a circuit to select which of Dodd and Deven, Drise and Dfall should be set to based on the column address Y0, and its circuit configuration is shown in FIG. 5. As shown in FIG. 5, the selector 62 is provided with four transfer gates 90 to 96 such that any two of them conduct in accordance with the logical level of the column address Y0. Concretely, when the logical level of the column address Y0 is "H", the transfer gates 90 and 96 conduct, Drise and Dodd are connected together, and Dfall and Deven are connected together. When the logical level of the column address Y0 is "L", the transfer gates 92 and 94 conduct, Drise and Dodd are connected together, and Dfall and Deven are connected together. However, the circuit configuration of the selector 62 shown in FIG. 5 is only a preferred example according to the present embodiment, and any different circuits from the circuit shown in FIG. 5 may be used, so long as they have the same function.

The amplifier AMPO64 is an amplifier which amplifies the Dodd into a write signal DO, and when a mask signal MA' is at a high level (activated state), the operation is inhibited. Also, the amplifier AMPE66 is an amplifier which amplifies the Deven into a write signal DE, and when a mask signal MB' is at a high level (activated state), the operation is inhibited.

Also, the mask signals MA and MB are signals which, of continuous addresses to be written in, inhibit (mask) writing in a specific address at the time of continuous writing. These mask signals MA and MB are signals which are generated within the chip when the mask signal to be supplied to a mask terminal DM (not shown) enters an activated state. When a mask signal to be supplied to the mask terminal DM enters an activated state in write timing of an odd address, the mask signal MA is activated, and when a mask signal to be supplied to the mask terminal DM enters an activated state in write timing of an even address, the mask signal MB is activated As shown in FIG. 4, the mask signal MA becomes a mask signal MA' via a NOR gate 74 and an inverter 78. Therefore, when the mask signal MA reaches a high level, the mask signal MA' also always reaches a high level, thus inhibiting the operation of the amplifier AMPO64. Similarly, the mask signal MB also becomes a mask signal MB' via a NOR gate 76 and an inverter 80. Therefore, when the mask signal MB reaches a high level, the mask signal MB' also always reaches a high level, thus inhibiting the operation of the amplifier AMPE66.

Concerning the operation of the input unit 60 constructed as described above, the description will be made of the operation when the test signal TESTA is at a low level (inactivated state) and when it is at a high level (activated state) separately.

FIG. 6 is a timing chart showing an operation of an input unit 60 when the test signal TESTA is at a low level. In FIG. 6, a signal to be supplied to the data input/output terminal DQ is fetched in response to both edges of the timing signal DQS, and portions which become Drise and Dfall respectively are as already described. FIG. 6 shows a case where the column address Y0 is at a high level, and in response thereto, the selector 62 selects Drise as Dodd, and Dfall as Deven. These Dodd and Deven are amplified by the amplifier AMPO64 and amplifier AMPE66 respectively and are written in the memory cell in parallel as write signals DO and DE. In this respect, the column address Y0 is a least significant address applied to an address terminal (not shown) at timing which the column address should be fetched.

In this case, if the mask signals MA and MB maintain the low level, the Dodd and Deven will be amplified by the amplifiers AMPO64 and AMPE66 into write signals DO and DE respectively, and written in the corresponding memory cells in parallel. If the mask signal MA or MB reaches a high level at predetermined timing, only writing at that timing will be inhibited. For example, if the mask signal MA reaches a high level at timing (See FIG. 6) at which Dodd and Deven become D2 and D3 respectively, only writing of D2 will be inhibited, and writing of other data D0, D1 and D3 will be performed as usual.

Figure 7:
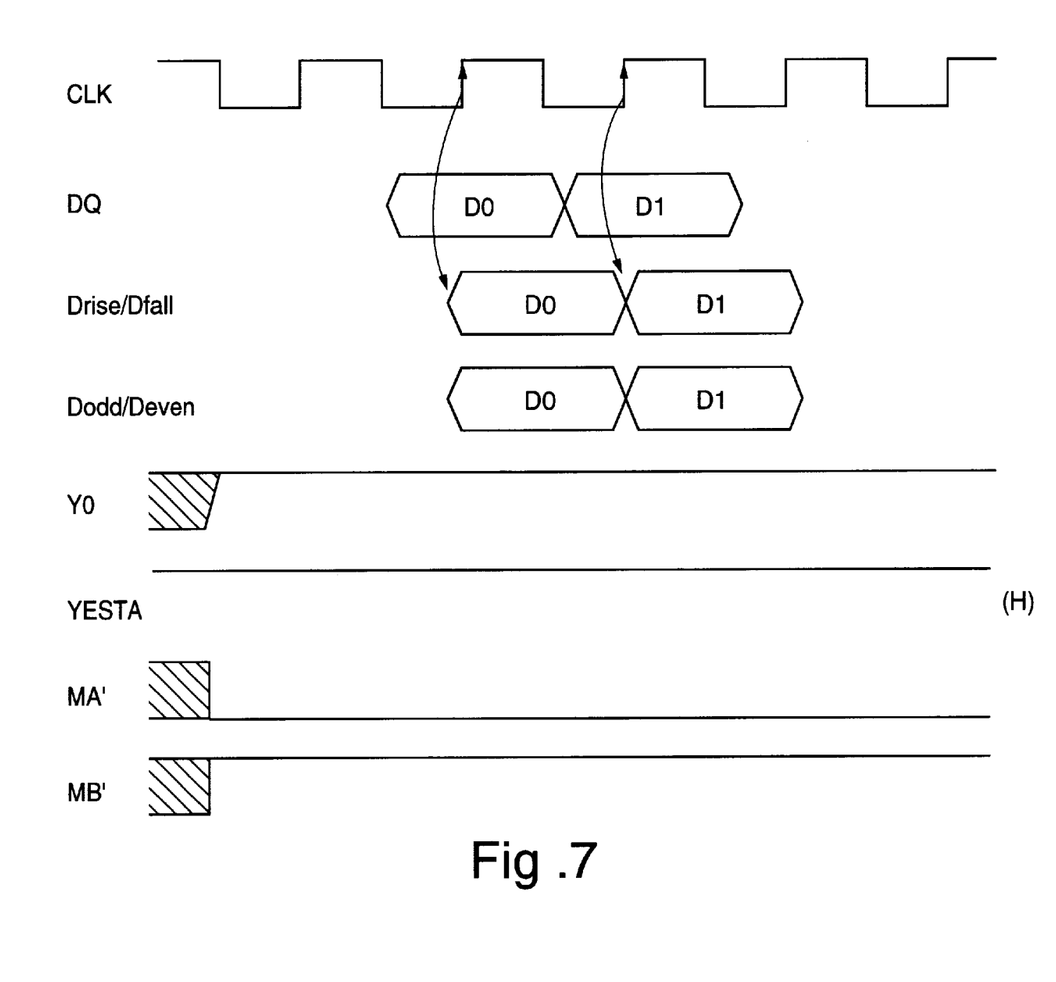
FIG. 7 is a timing chart showing the operation of the input unit 60 shown in FIG. 4.

With reference to FIG. 7, the description will be made of a case where the test signal TESTA is at a high level. In this case, either of Drise and Dfall is a signal to be fetched at the leading edge of the clock signal CLK irrespective of the timing signal DQS and the inversion clock signal CLKB in the input/latch circuit 10 as described above. FIG. 7 also shows the case where the column address Y0 is at a high level, and when the test signal TESTA is at a high level, Drise and Dfall have the same data, and therefore, the selection operation by the selector 62 remains unchanged between when the column address Y0 is at a high level and when it is at a low level.

The test signal TESTA is also supplied to NAND gates 68 and 70, and a signal obtained by inverting the column address Y0 is applied to the other input end of the NAND gate 68 while the column address Y0 is applied to the other input end of the NAND gate 70.

For this reason, when the test signal TESTA is at a high level, the output of either of the NAND gates 68 and 70 always reaches a low level. Concretely, when the column address Y0 is at a low level, the output from the NAND gate 68 reaches a low level, and when the column address Y0 is at a high level, the output from the NAND gate 70 reaches a low level. This means that when the test signal TESTA is at a high level, either of the mask signals MA' and MB' always reaches a high level (activated state). More specifically, when the column address Y0 is at a low level, the mask signal MA' is activated to inhibit the operation of the amplifier AMPO64, and when the column address Y0 is at a high level, the mask signal MB' is activated to inhibit the operation of the amplifier AMPE66. In FIG. 7, the mask signal MB' is activated to inhibit the operation of the amplifier AMPE66 because it shows a case where the column address Y0 is at a high level.

When the column address Y0 indicates a low level as described above, that is, when the column address is an even number, the operation of the amplifier AMPO64 is inhibited and write data are supplied only to the even number address side, while when the column address Y0 indicates a high level, that is, when the column address is an odd number, the operation of the amplifier AMPE66 is inhibited and write data are supplied only to the odd number address side. When the test signal TESTA is at a high level as described above, writing is to be performed one address at a time.

The advantage that such writing can be performed is as follows. That is, in the DDR-SDRAM, 2, 4 and 8 can be set for the burst length, but since data to be supplied at a frequency twice as high as that of the clock signal CLK are arranged in parallel within, burst length of 1 cannot be set, but writing one address at a time cannot be originally performed unless control using a mask signal is made. In a normal SDRAM, however, it is possible to set the burst length to 1, and therefore, in a case where there is prepared a test pattern in which burst length of 1 is supposed, when the test signal TESTA reaches a high level, writing one address at a time is automatically performed according to the present embodiment. Accordingly, it becomes possible to apply such a test pattern as it is to the DDR-SDRAM.

Further, in the bar-in test, a test may be conducted on such a condition that data stored in memory cells which are adjacent to each other are made into data which are different from each other as described above. Depending upon the structure of the chip, however, there are a case (See FIG. 10) where the cell array is divided in accordance with the logical level of the column address Y0, and a case (See FIG. 11) where the cell array is not divided depending upon the logical level of the column address Y0, but a memory cell corresponding to an address of column address Y0=1 and a memory cell corresponding to an address of column address Y0=0 are adjacent to each other. In the latter case, when there always exists a relation of DO=DE during the test, it becomes impossible to store such a pattern as described above.

Figure 11:
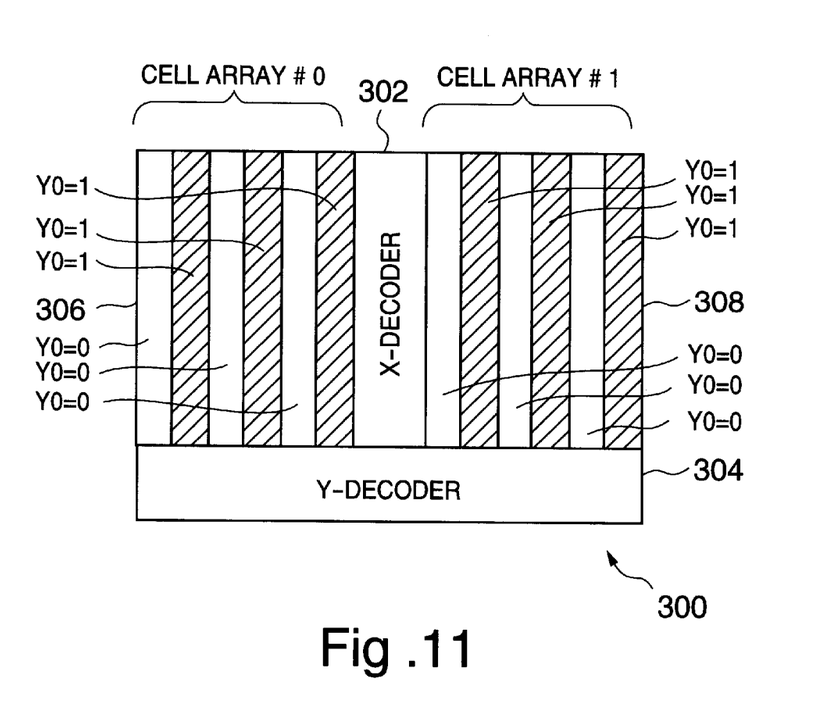
FIG. 11 shows an example of chip structure in which a cell array is not divided depending on the logical level of a column address Y0, but a memory cell corresponding to an address having a column address Y0=1, and a memory cell corresponding to an address having a column address Y0=0 are adjacent to each other.

If, however, the operation of the amplifier AMPO64 or the amplifier AMPE66 is inhibited in response to the logical level of the column address Y0 like the input unit 60 shown in FIG. 4 and writing in DO alone or in DE alone is made possible, it will become possible to write a desired pattern even in a chip having such structure as shown in FIG. 11. Therefore, inhibiting the operation of one of the amplifiers like the input unit 60 shown in FIG. 4 is particularly suitable for such chip structure as shown in FIG. 11.

Although the description has been made of the embodiments according to the present invention in the foregoing, the present invention is not limited thereto, but various modifications can be performed. For example, as means for masking the DO or DE in the input unit 60, the operation of the amplifier AMPO64 or amplifier AMPE66 is inhibited, but the present invention is not limited thereto, but any other means may be used so long as it is means for preventing the DO or DE from being written in a memory cell to be accessed.

[Effect of the Invention]

As described above, according to the present invention, it is possible to provide a semiconductor memory capable of conducting, at low cost, various tests to be conducted before shipment without affecting the normal operations.

What is claimed is:

1. A semiconductor memory, comprising: a first flip flop circuit for holding, in response to a clock signal, a first write data fetched in response to one edge of a timing signal; a second flip flop circuit for holding, in response to said clock signal, a second write data fetched in response to the other edge of said timing signal; and a write circuit for writing the first and second write data held by said first and second flip flop circuits on memory cell array in parallel, having means for storing common write data in said first and second flip flop circuits in response to said clock signal independently of said timing signal during a test.

2. The semiconductor memory according to claim 1, further comprising: a third flip flop circuit for holding a first write data in response to said one edge of said timing signal; and a fourth flip flop circuit for holding a second write data in response to said other edge of said timing signal, wherein said means supplies the first and second write data held by said third and fourth flip flop circuits to said first and second flip flop circuits respectively during a normal operation, and supplies write data to said first and second flip flops in common while the first and second write data held by said third and fourth flip flop circuits are inhibited from being supplied to said first and respectively during said test.

3. The semiconductor memory according to claim 1, wherein said write circuit is provided with: a first amplifier for writing a first write data held by said first flip flop circuit on said memory cell array; a second amplifier for writing a second write data held by said second flip flop circuit on said memory cell array; and inhibit means for inhibiting an operation of either of said first and second amplifiers during said test.

4. The semiconductor memory according to claim 3, wherein said inhibit means determines an operation of which of said amplifiers should be inhibited based on part of an address signal.

5. The semiconductor memory according to claim 4, wherein said part of said address signal is a specific bit of a column address, and wherein in said memory cell array, two memory cells being different from each other only in said specific bit of said column address are arranged adjacent to each other.

6. A DDR-SDPAM for fetching write data at one and the other edges of a timing signal, comprising: first write means for receiving a first write data fetched at said one edge of said timing signal to write them on a memory cell array; second write means for receiving a second write data fetched at said other edge of said timing signal to write them on said memory cell array; and means for receiving a test signal and a specific bit of a column address, and means for inhibiting, when said test signal is in an activated state, any write operations of either of said first and second write means based upon said specific bit of said column address.

7. The DDR-SDRAM according to claim 6, wherein said first and second write means include first and second amplifiers respectively, and wherein said inhibits means forcibly activates either of first and second mask signals for inhibiting operations of said first and second amplifiers respectively.

* * * * *